US006647032B1

(12) United States Patent
Lee et al.

(10) Patent No.: US 6,647,032 B1
(45) Date of Patent: Nov. 11, 2003

(54) THERMALLY WAVELENGTH TUNABLE LASER HAVING SELECTIVELY ACTIVATED GRATINGS

(75) Inventors: Shing Lee, Fremont, CA (US); David A. G. Deacon, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/066,055

(22) Filed: Jan. 31, 2002

(51) Int. Cl.$^7$ .................................................. H01S 3/10
(52) U.S. Cl. ........................................ 372/20; 372/24
(58) Field of Search ...................... 372/34, 20

(56) References Cited

U.S. PATENT DOCUMENTS

| | | | |
|---|---|---|---|
| 4,006,963 A | 2/1977 | Baues et al. | 350/96 C |
| 5,182,665 A | 1/1993 | O'Callaghan et al. | 359/95 |
| 5,504,772 A | 4/1996 | Deacon et al. | 372/102 |
| 5,513,196 A * | 4/1996 | Bischel et al. | 372/22 |
| 5,581,572 A | 12/1996 | Delorme et al. | 372/50 |
| 5,732,102 A | 3/1998 | Bouadma | 372/96 |
| 5,995,691 A * | 11/1999 | Arai et al. | 385/37 |
| 6,243,517 B1 * | 6/2001 | Deacon | 385/50 |
| 6,377,716 B1 * | 4/2002 | Veldhuis et al. | 385/1 |
| 6,490,391 B1 * | 12/2002 | Zhao et al. | 385/30 |

FOREIGN PATENT DOCUMENTS

GB          2286057 A           2/1995

OTHER PUBLICATIONS

P.J. Rigole et al., "State of the Art: Widely Tunable Lasers", *SPIE*, vol. 3001, pp. 382–393. No Date.

D.M. Adams et al., "Module–Packaged Tunable Laser and Wavelength Locker Delivering 40 mW of Fibre–Coupled Power on 34 Channels", *Electronics Letters*, vol. 37, No. 11, May 24, 2001, pp. 691–693.

L. Eldada et al., "Thermally Tunable Polymer Bragg Grating OADM's", *OFC '99 100C*, Feb. 25, 1999, 4 pages.

S. Ura et al., "Electro–Optic Functional Waveguide Using New Polymer p–NAn–PVA for Integrated Photonic Devices", *J. Appl. Phys.*, vol. 31, 1992, pp. 1378–1381.

L. Eldada et al., "Thermo–Optically Active Polymeric Photonic Components", *OFC '2000 OFCC*, Mar. 8, 2000, 4 pages.

H–F. Liu et al., "Polymer Tunable Laser", *LEOS 2001*, Nov. 11–15, 2001, 5 pages.

* cited by examiner

*Primary Examiner*—Paul Ip
*Assistant Examiner*—Leith Al-Nazer
(74) *Attorney, Agent, or Firm*—Charles K. Young

(57) ABSTRACT

A thermally wavelength tunable laser having selectively activated gratings includes a core, more than one periodic arrangement adjacent to the core, and thermo-optical material adjacent to each periodic arrangement. At an off temperature, the refractive index of the periodic arrangement and the adjacent thermo-optical material is the same. By selectively changing the temperature and hence the refractive index in the thermo-optical material adjacent to a selected periodic arrangement, the selected periodic arrangement forms a diffraction grating which can be tuned over a selected wavelength range. By selecting different periodic arrangements, different, non-overlapping wavelength ranges can be selected and the laser can be tuned over a broad range of wavelengths.

76 Claims, 9 Drawing Sheets

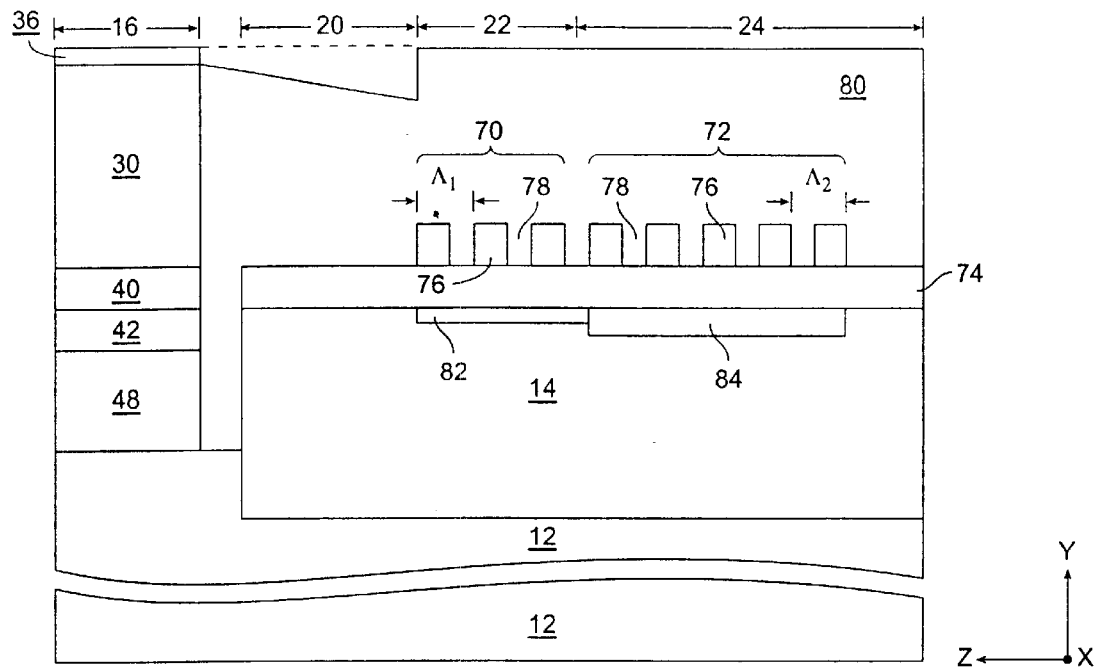
FIG. 1C(1)
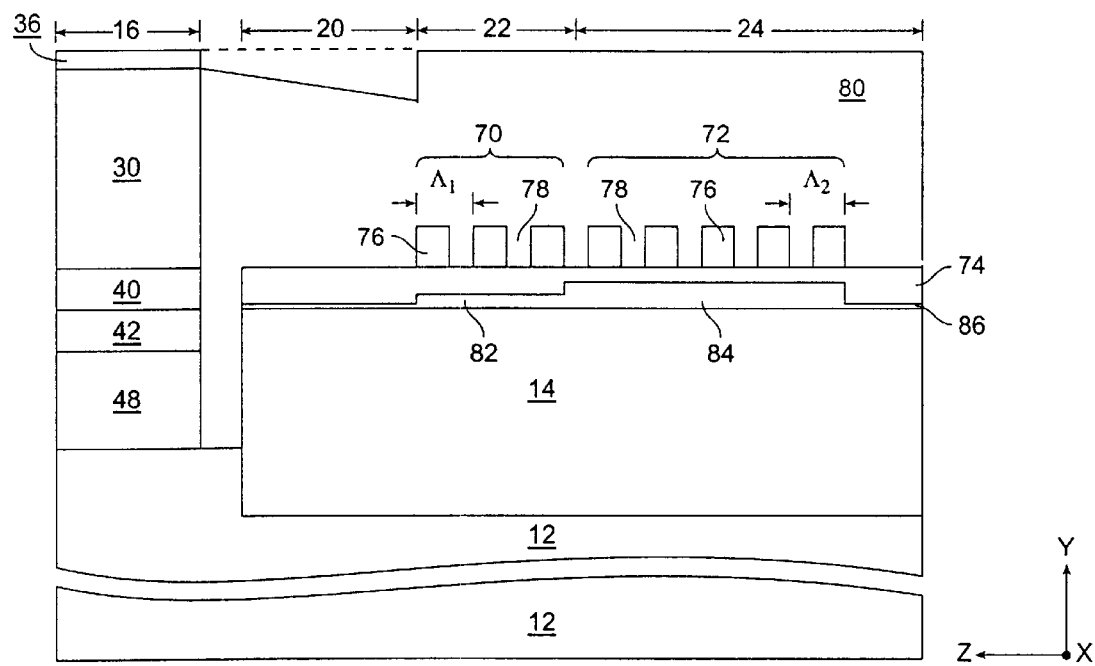
FIG. 1C(2)

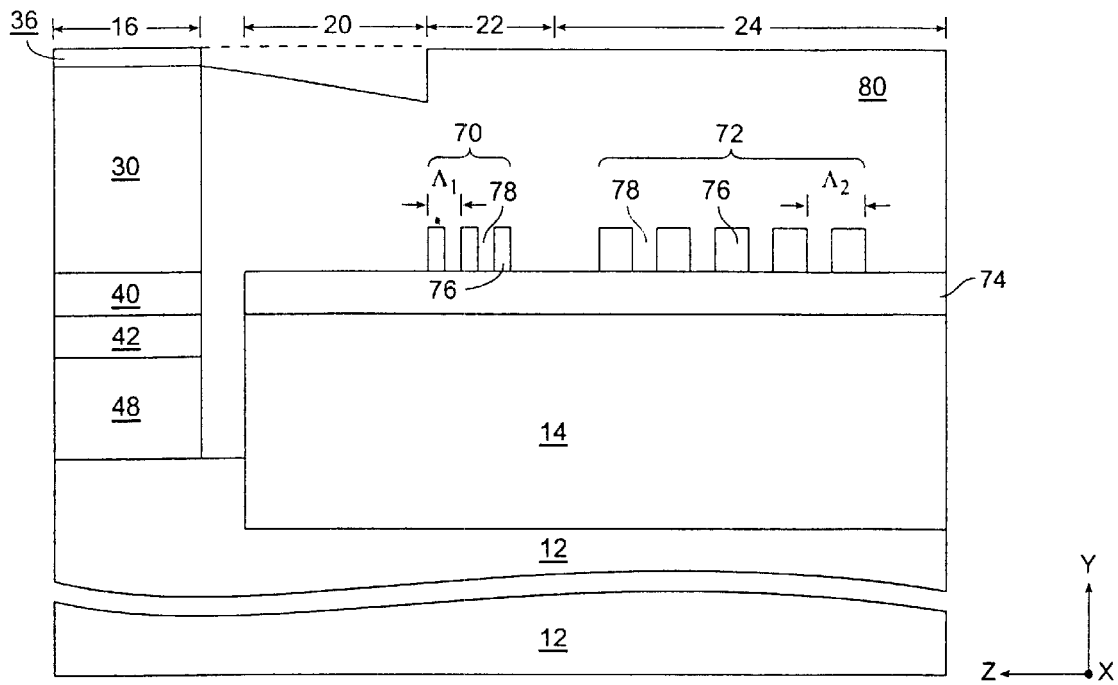
FIG. 1C(3)
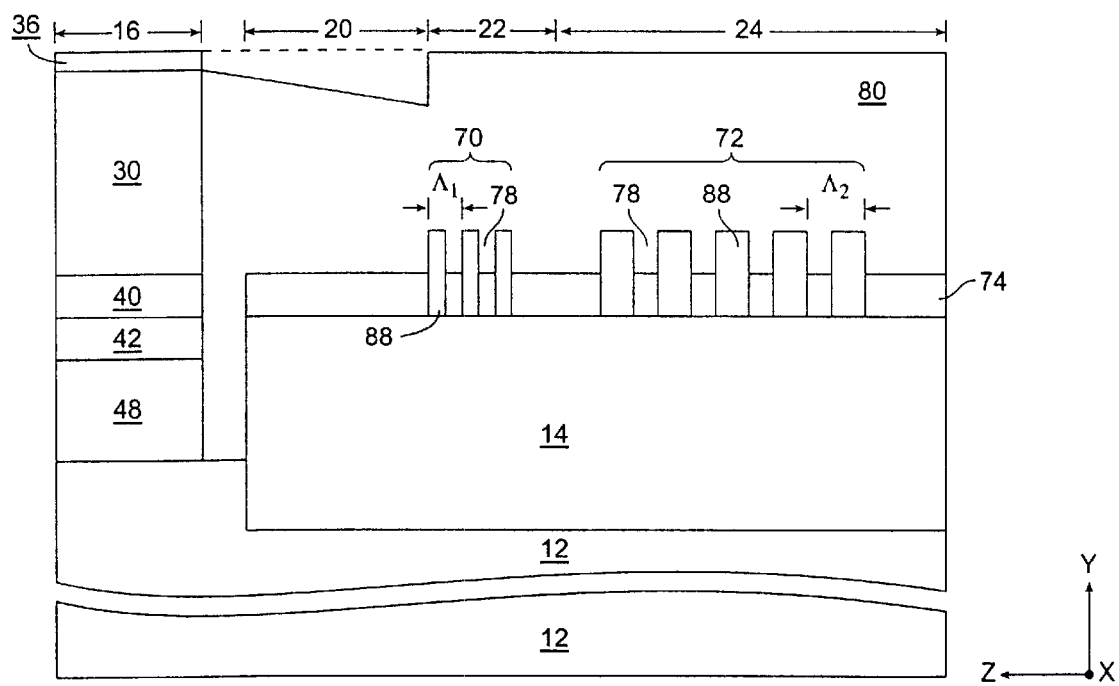
FIG. 1C(4)

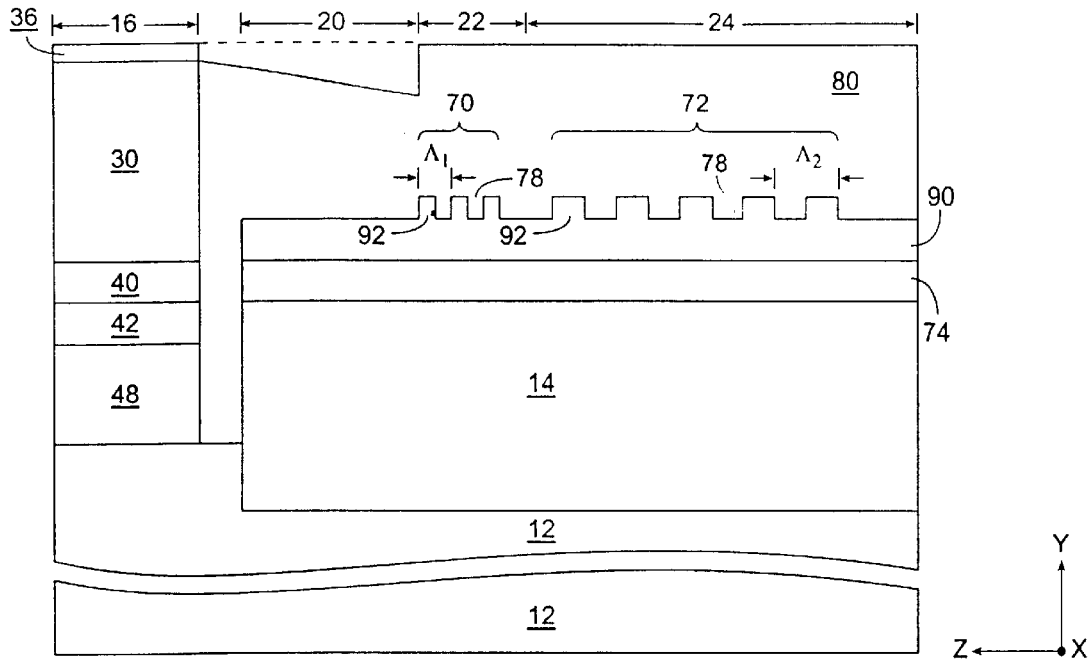
FIG. 1C(5)
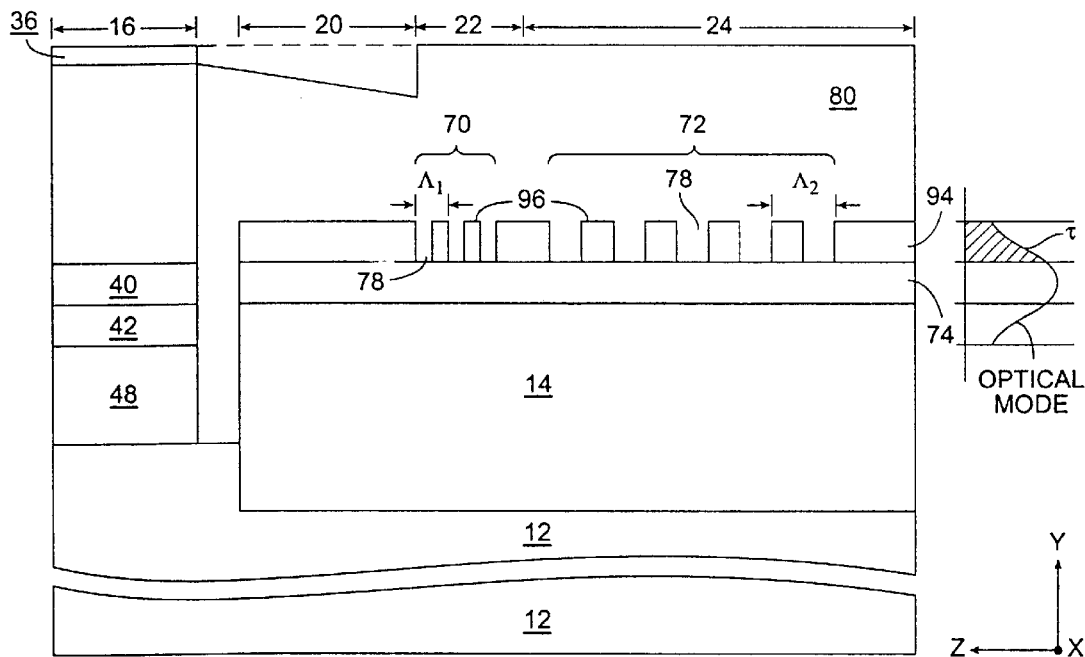
FIG. 1C(6)

THERMALLY WAVELENGTH TUNABLE LASER HAVING SELECTIVELY ACTIVATED GRATINGS

BACKGROUND OF THE INVENTION

1. Field of the Invention

This invention relates to the field of optical devices that manipulate light of tightly controlled wavelength, particularly for use in communication applications. More particularly, the invention relates to lasers that produce light of a specified wavelength and which can be tuned or switched to other specified wavelengths by thermal means.

2. Description of the Related Art

Over the past several years, there has been ever increasing interest in tunable lasers for use in optical communication systems, in general, and for use in dense wavelength division multiplexing (DWDM) applications, in particular. DWDM allows high bandwidth use of existing optical fibers, but requires components that have a broad tunable range and a high spectral selectivity. Such components should be able to access a large number of wavelengths within the S-band (1490–1525 nanometers), the C-band (1528–1563 nanometers), and the L-band (1570–1605 nanometers), each different wavelength separated from adjacent wavelengths by a frequency separation of 100 GHz, 50 GHz, or perhaps even 25 GHz, according to the system implementation.

The distributed Bragg reflector (DBR) laser was one of the first tunable lasers used in optical communication. The DBR laser consisted of a semiconductor amplifier medium, defining an active section, and an optical waveguide. The optical waveguide included a portion without a grating that defined a phase control section and a portion in which a single grating of typically constant pitch ($\Lambda$) was formed which constituted a distributed Bragg reflector or, more simply, the Bragg section, that reflected light at the Bragg wavelength $\lambda_B$. The optical waveguide was defined by an organic layer which constituted a core with another organic confinement layer disposed both above and below the core. Wavelength tuning of such a DBR laser was performed by either injecting current or transferring heat into the phase control section, the Bragg section, or both. Injecting current made it possible to vary the refractive index of the waveguide and thus control the Bragg wavelength $\lambda_B$ by the equation $\lambda_B = 2n_{eff}\Lambda$ where $\Lambda$ is the pitch of the grating and $n_{eff}$ is the effective refractive index of the waveguide. Alternatively, a pair of heating resistance strips were disposed on opposite outer surfaces of the laser component at the phase control section, the Bragg section, or both. By independently controlling the voltages to the resistance strips, the temperature and hence the index of refraction of the organic layers that form the optical waveguide was controlled via the thermo-optical effect. The DBR laser was continuously tuned over a small wavelength tuning range of approximately 10 nanometers. For a more detailed discussion of a wavelength tunable DBR laser by heating, please refer to U.S. Pat. No. 5,732,102 by Bouadma entitled "Laser Component Having A Bragg Reflector of Organic Material, And Method of Making It" which is hereby incorporated by reference.

The DBR laser with selectively activated virtual diffraction gratings (Variation DBR Laser) was a variation of the DBR laser that employed current injection as the mechanism for wavelength tuning. The Variation DBR Laser replaced the single Bragg grating associated with a conventional DBR laser with a plurality of selectively activated virtual diffraction gratings. Specifically, the Variation DBR Laser included a plurality of periodic arrangements that constituted a plurality of virtual diffraction gratings. Each virtual diffraction grating had a different Bragg wavelength and hence a different wavelength tuning range. Injecting current into a first periodic arrangement created a first diffraction grating with a first Bragg wavelength which made it possible to vary the refractive index of the waveguide and wavelength tune the laser around the first Bragg wavelength. The switching of the injection current from the first periodic arrangement to a second periodic arrangement replaced the first diffraction grating with a second diffraction grating that had a second Bragg wavelength which made it possible to wavelength tune the laser over a range of wavelengths around the second Bragg wavelength. The Variation DBR Laser could be discontinuously tuned (in jumps) over a wavelength range several times the tuning range associated with the DBR laser. However, tuning by injection current had the disadvantage of increased optical cavity loss, increased optical noise, low output power, and the tradeoff between tuning and loss. For a more detailed discussion of a variation DBR by injection current, please refer to U.S. Pat. No. 5,581,572 by Delorme et al. entitled "Wavelength-Tunable, Distributed Bragg Reflector Laser Having Selectively Activated, Virtual Diffraction Grating." Further, for a discussion on tunable lasers in general, please refer to a paper by Rigole et al. entitled "State-of-the-art: Widely Tunable Lasers," SPIE, Vol. 3001, Pages 382–393, 1997. Both the Delorme patent and the Rigole paper are hereby incorporated by reference.

SUMMARY OF THE INVENTION

The present invention relates to a distributed Bragg reflector laser whose wavelength tuning range is comparable to that of the Variation DBR Laser but does not suffer the shortcomings associated with using injection current as the mechanism for wavelength tuning.

In the laser according to the invention, the mechanism for wavelength tuning is the changing of temperature and hence the refractive index of thermo-optical material adjacent to periodic arrangements. Thermo-optical material has a large dn/dt, that is, a change in temperature of the thermo-optical material will substantially change the refractive index of the thermo-optical material. Further, the thermo-optical material has a large dn/dt over a large temperature range which allows for a large potential tuning range.

According to the invention, changing the temperature of the thermo-optical material adjacent to a chosen periodic arrangement changes the refractive index of the thermo-optical material such that the refractive index of the thermo-optical material begins to differ from the refractive index of the adjacent periodic arrangement. This difference in refractive index creates or activates a diffraction grating with a Bragg wavelength which is associated with the chosen periodic arrangement. In the current industry jargon, the diffraction grating is "weakly" on and will reflect light at the Bragg wavelength.

Alternatively, when the thermo-optical material adjacent to the chosen periodic arrangement is at an off temperature, the refractive index of the periodic arrangement and the adjacent thermo-optical material are nearly the same, no diffraction grating is created or activated (within a tolerance factor for variations in refractive index), and no light is reflected.

As the temperature in the thermo-optical material adjacent to the chosen periodic arrangement continues to increase or decrease beyond the off temperature (depending on the composition of the thermo-optical material), the difference in the refractive index between the chosen periodic arrangement and the adjacent thermo-optical material also increases. This increased difference in the refractive index increases the reflectivity of the diffraction grating associated with the chosen periodic arrangement and also shifts the Bragg wavelength. In the current industry jargon, the diffraction grating is "strengthened."

Switching (the activation) from a first to a second diffraction grating requires changing the temperature of the thermo-optical material adjacent to the first periodic arrangement back to the off temperature and changing the temperature of the thermo-optical material adjacent to the second periodic arrangement to a temperature other than the off temperature. This de-activates and hence eliminates the first diffraction grating and creates and hence activates the second diffraction grating with a second Bragg wavelength.

Typically, a single diffraction grating is activated at a given time. Each Bragg wavelength associated with each diffraction grating differs from all others. The range of wavelength tuning associated with a given diffraction grating is such that there is little or no overlap with any other wavelength tuning range of any other diffraction grating. Thus, by properly modulating the activation of each periodic arrangement, the laser has a very large tuning range associated with the net wavelength coverage of all the grating tuning ranges.

In the laser according to this invention, the periodic arrangements are adjacent to a core of a waveguide or, alternatively, the periodic arrangements are part of a layer which is adjacent to the core of the waveguide. Each periodic arrangement has a period which corresponds to the pitch of the associated diffraction grating when activated. In some embodiments, all the pitches are the same and, in other embodiments, each pitch is different. More specifically, a laser according to this invention includes a gain means with an active emission section which is optically coupled to a core of a waveguide and a substrate which supports both the gain means and the waveguide. More than one periodic arrangement is formed adjacent to the core or, alternatively, a layer which includes more than one periodic arrangement is formed adjacent to the core. Thermo-optical material is adjacent to each periodic arrangement and temperature changing means are disposed in the thermo-optical materials that are adjacent to each periodic arrangement. When the thermo-optical material adjacent to a periodic arrangement is at an off temperature, the refractive index of the thermo-optical material adjacent to the periodic arrangement is the same as the refractive index of the periodic arrangement and no diffractive grating is created or activated.

Between the gain means and the periodic arrangements along a periodic arrangement free-portion of the core, there may be a phase control section which can slightly shift the cavity modes associated with the laser. Also, beneath the core and associated with each periodic arrangement, the substrate may include index loading regions so that there is a different effective index of the optical mode for each periodic arrangement when the period of all the periodic arrangements is the same.

The thermo-optical material of the tunable laser is preferably selected so as to have a high coefficient of variation in refractive index as a function of temperature, the magnitude of which should be preferably greater than $1 \times 10^{-4}/°C$. Examples of thermo-optical material used in the laser and that exhibit these characteristics include polymers derived from methacrylate, siloxane, carbonate, styrene, cyclic olefin, or norbornene.

It should be observed that, except for the gain means, the laser is fabricated using Si processing technology and only the gain means is of GaAs, InP, InGaAsP, or other direct bandgap materials or gain mediums which requires complex and sensitive processing technology, such as epitaxial growth and cleaving. The gain means is independently fabricated with a minimum of structure. Accordingly, the laser is easy to manufacture, cost effective, and results in high yield.

BRIEF DESCRIPTION OF THE DRAWINGS

Other objects and advantages of the invention will become apparent upon reading the following detailed description and upon reference to the accompanying drawings in which:

FIG. 1C(1) is a first embodiment of a side view along line 1C(1)—1C(1) in FIG. 1A;

FIG. 1C(2) is a second embodiment of a side view along line 1C(2)—1C(2) in FIG. 1A;

FIG. 1C(3) is a third embodiment of a side view along line 1C(3)—1C(3) in FIG. 1A;

FIG. 1C(4) is a forth embodiment of a side view along line 1C(4)—1C(4) in FIG. 1A;

FIG. 1C(5) is a fifth embodiment of a side view along line 1C(5)—1C(5) in FIG. 1A;

FIG. 1C(6) is a sixth embodiment of a side view along line 1C(6)—1C(6) in FIG. 1A;

Figure 1A:
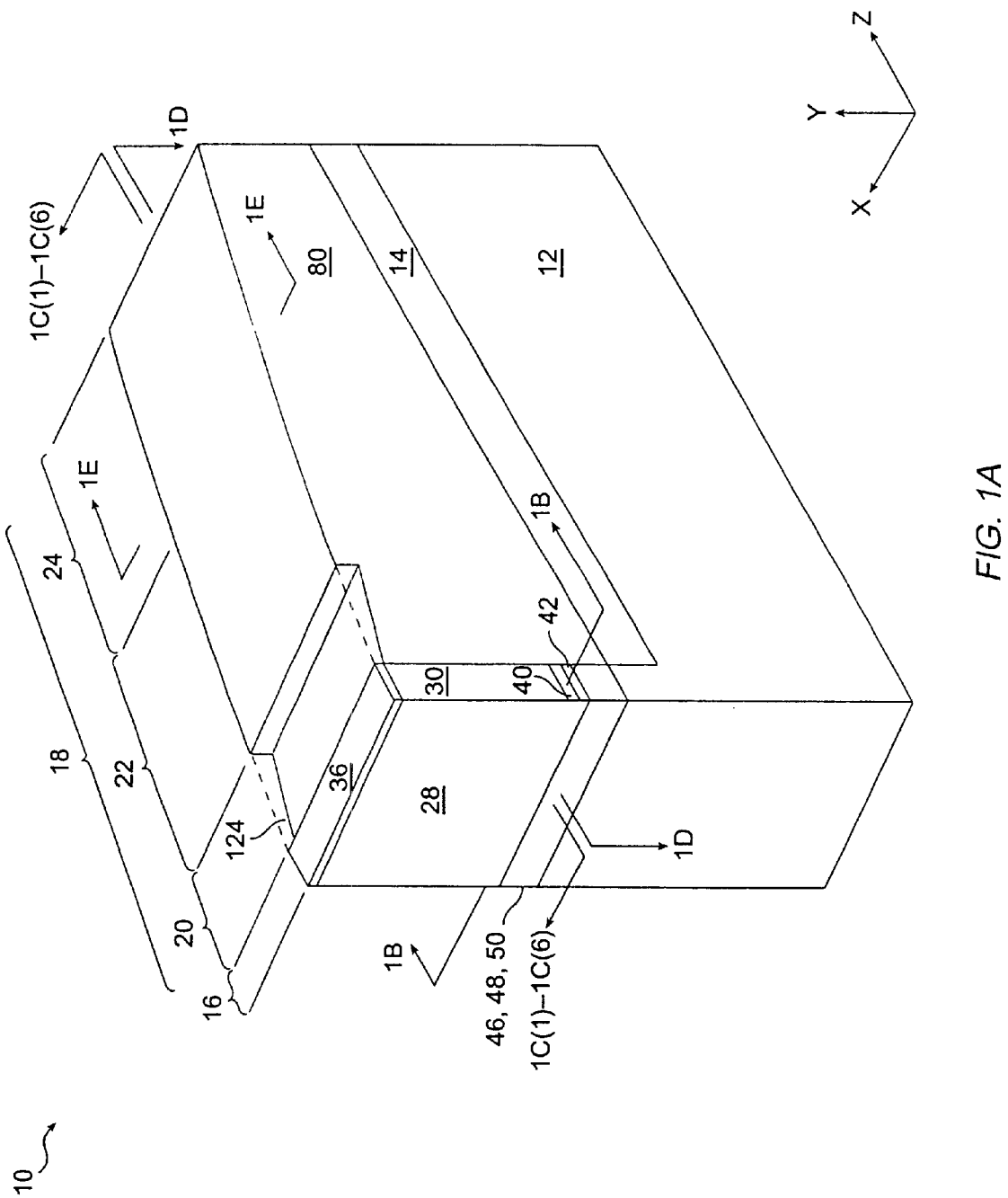
FIG. 1A is a right side elevational view of the laser according to principals of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

A laser according to the invention, and which is shown diagrammatically in FIG. 1, results from the modification of the Variation DBR Laser and the introduction of periodic arrangements adjacent to a core of a waveguide, thermo-optical material adjacent to each periodic arrangement, and temperature changing means within the thermo-optical material adjacent to each periodic arrangement.

In order to activate a periodic arrangement by thermal means, use is made of changing the temperature and hence the refractive index of thermo-optical material adjacent to a chosen periodic arrangement thereby creating and hence activating a diffractive grating with a Bragg wavelength. Thermo-optical material has a large dn/dt, that is, a change in temperature of the thermo-optical material will substantially change the refractive index of the thermo-optical material. Further, the thermo-optical material has a large dn/dt over a large temperature range which allows for a large potential tuning range.

When the thermo-optical material adjacent to a chosen periodic arrangement is at an off temperature, the refractive index of the chosen periodic arrangement and the adjacent thermo-optical material is nearly the same so that no diffraction grating is created or activated, within a tolerance factor for variations in refractive index.

Changing the temperature of thermo-optical material adjacent to the chosen periodic arrangement from the off temperature changes the refractive index of that thermo-optical material such that the refractive index of that thermo-optical material differs from the refractive index of the chosen periodic arrangement. This difference in refractive index creates and hence activates a diffraction grating with a Bragg wavelength. Note that the refractive index of a material is also known as the index of refraction of the material.

Switching from a first to a second diffraction grating requires changing the temperature of the thermo-optical material adjacent to a first periodic arrangement back to the off temperature and changing the temperature of the thermo-optical material adjacent to a second periodic arrangement to a temperature other than the off temperature. This de-activates and hence eliminates the first diffraction grating and creates and hence activates the second diffraction grating with a second Bragg wavelength.

Typically, a single diffraction grating is activated at a given time. Each Bragg wavelength associated with each diffraction grating differs from all others. The range of wavelength tuning associated with a given diffraction grating is such that there is little or no overlap with any other wavelength tuning range of any other diffraction grating. Thus, by properly modulating the activation of each periodic arrangement, the laser has a very large tuning range associated with the net wavelength coverage of all the grating tuning ranges.

Referring now to FIG. 1A, there is shown an embodiment of the laser 10 that is highly wavelength tunable and has high spectral selectivity. On a substrate 12 which supports a cladding layer 14, the laser 10 includes a gain means 16 which provides light and a passive section 18 which processes the light received from the gain means 16. The passive section 18 includes a phase control section 20 and more the than one periodic arrangement sections. In FIG. 1A, the laser 10 includes a first and a second periodic arrangement sections 22 and 24, respectively. The number of periodic arrangement sections depends on the design of the laser and usually will be greater than two.

Most generally, the gain means 16 provides sufficient optical gain to overcome the losses associated with the laser 10 and to create oscillation within the laser 10. The gain means 16 includes a first facet 26 (FIG. 1D) and a second facet 28. The second facet 28, most preferably, has a highly reflective (HR) coating thereon, but may also have a partially reflective and partially transmissive coating thereon, depending on whether light will be outputted from this facet.

Figure 1B:
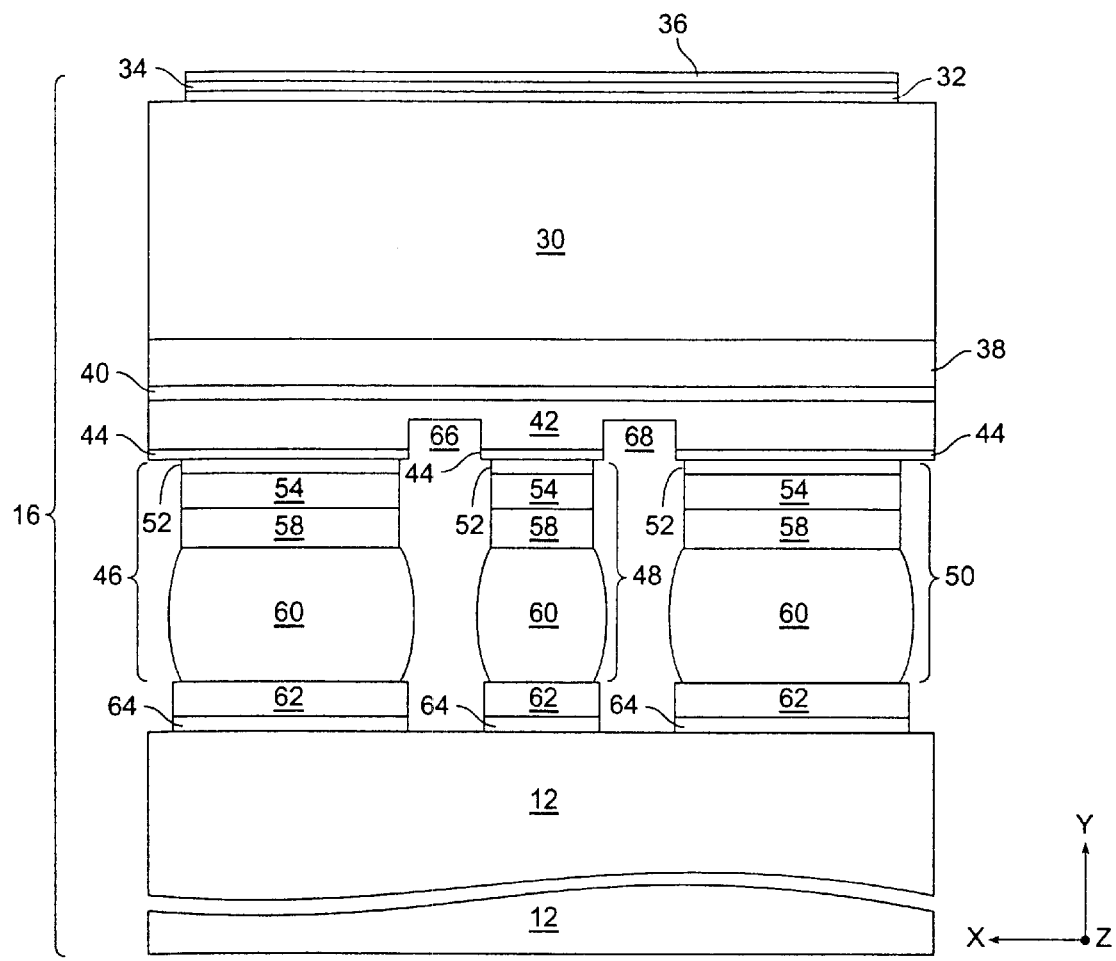
FIG. 1B is a detailed front view of the laser diode along the line 1B—1B shown in FIG. 1A.

Referring now to FIG. 1B, the gain means 16 has been flipped over and flip chip bonded to the cladding layer 14. The gain means 16 is a solid-state laser which is preferably a semiconductor diode laser. The gain means 16 may be a ridge laser or a buried hetro-structure with or without multiple quantum wells. As shown, the gain means 16 is a ridge laser that is preferably fabricated on InP so as to emit in the 1550 nm region or the 1310 nm region.

Alternatively, the gain means 16 may be fabricated on other convenient substrates such as sapphire or gallium arsenide. The gain means 16 includes a substrate 30 of n-type InP and sequentially deposited on a major surface of the substrate is an adhesion layer 32 typically formed of titanium, a diffusion barrier layer 34 typically formed of platinum, and a bonding layer 36 typically formed of gold. A first clad layer 38 is formed on the other major surface of the substrate 30. An active emission layer 40 of a semiconductor material, such as InGaAsP or InGaAlP that preferably includes strained quantum wells, is formed on a major surface of the first clad layer 38 and provides the optical gain of the laser 10. The dimensions of the active emission layer 40 are variable, but may typically be a fraction of a micron in the y direction (thickness) and at least a couple of microns in the x direction (width). The light produced by the active emission layer 40 is typically a single transverse mode with a mode size at full width half maximum (FWHM) of approximately 0.6 microns in the y direction (height) and approximately 3 microns in the x direction (width). A second clad layer 42 is disposed on the other major surface of the active emission layer 40. Both clad layers 38 and 42 are formed of a lower refractive index semiconductor material than the active emission layer 40. On the surface of the second clad layer 42, a contact layer 44 which provides low electrical resistance is grown. All of these layers may be structured into sublayers as is known in the art.

A plurality of solder balls 46, 48, and 50 connect the gain means 16 to the substrate 12. Each solder ball includes a first adhesion layer 52 typically formed of titanium, a diffusion barrier layer 54 typically formed of platinum, a bonding layer 58 typically formed of gold, a solder ball 60 typically formed of 80% gold and 20% tin, a bonding layer 62 typically formed of gold, and a second adhesion layer 64 typically formed of chromium. Many alternative solder, barrier, adhesion, and dewetting materials may also be used, to enable processing at different temperatures, as may be alternative metal layers. An external electrical contact (not shown) exists on the bonding layer 36 and the bonding layer 62 of the central solder ball 48 thereby enabling the active emission layer 40 to be fed with amplification current in the region of the optical mode. Trenches 66 and 68 are etched through the contact layer 44 and through most of the cap layer 42 on both sides of the central solder ball 48 which effectively bounds most of the generated light to the active emission layer 40 between the trenches 66 and 68.

During operation, the gain means 16 generates several hundred milli-watts of thermal power, the majority of which is generated in the active emission layer 40 between the trenches 66 and 68, and this thermal power is dissipated through an efficient thermal flow through and beneath the gain means 16. Thermal power generated in the active emission layer 40 is dissipated through the plurality of solder balls 46, 48, and 50, and into the substrate 12 that is typically formed of silicon, but may be also formed of sapphire, gallium arsenide, indium phosphide, metal, glass, or ceramic. The substrate 12 is substantially thicker than the cladding layer 14 and acts as a heat reservoir for the tunable laser by maintaining a relatively constant temperature with a low thermal gradient. Preferably, the rise above ambient temperature in the gain means 16 is kept beneath 50° C. and, more preferably, beneath 10° C. A single or a plurality of heat sinks (not shown) may be disposed beneath the substrate 12 in order to aid in dissipating thermal power from, most importantly, the gain means 16, but also from the passive section 18, as the substrate 12 are common to the gain means 16 and the passive section 18. A thermal sensor (not shown) may also be disposed near the gain means 16 to control the heat sinks (not shown) and to thereby regulate the temperature in the gain means 16 and the substrate 12.

Each periodic arrangement section 22 and 24 has a periodic arrangement disposed within the laser 10. Six (6) different embodiments of a first and a second periodic arrangement 70 and 72 associated with the first and the second periodic arrangement section 22 and 24, respectively, are shown in FIGS. 1C(1)–1C(6). Each embodiment of the periodic arrangement discussed below is adjacent to a core 74, is made from an optical material such as, for example, optical glass or a semiconductor material such as, for example, silicon or silicon dioxide, and has a respective period which is designated $\Lambda_1$ and $\Lambda_2$, respectively.

Referring now to FIG. 1C(1), each periodic arrangement 70 and 72 has zones 76 formed on the top of the core 74. The zones 76 alternate with zones 78 made from a thermo-optical material 80, discussed more fully below. The period $\Lambda_1$ and $\Lambda_2$ associated with each periodic arrangement 70 and 72 are the same. Below each periodic arrangement 70 and 72, the cladding layer 14 includes index loading regions 82 and 84 of different refractive indexes which may be formed by differential doping, thermal, or other processes. Thus, at a given reference temperature, as an optical mode propagates past each periodic arrangement 70 and 72 and each corresponding index loading region 82 an 84, there is a different effective index of the mode.

Referring now to FIG. 1C(2), each periodic arrangement 70 and 72 has zones 76 formed on the top of the core 74. The zones 76 alternate with zones 78 made from a thermo-optical material 80, discussed more fully below. The period $\Lambda_1$ and $\Lambda_2$ associated with each periodic arrangement 70 and 72 are the same. A layer 86 includes index loading regions 82 and 84 of the same refractive index but different thicknesses. Thus, at a given reference temperature, as an optical mode propagates past each periodic arrangement 70 and 72 and each corresponding doped region 82 an 84, there is a different effective index of the mode.

Referring now to FIG. 1C(3), each periodic arrangement 70 and 72 has zones 76 formed on the top of the core 74. The zones 76 alternate with zones 78 made from a thermo-optical material 80, discussed more fully below. The period $\Lambda_1$ and $\Lambda_2$ associated with each periodic arrangement 70 and 72 differ. Further, although not shown, it is within the scope of this invention that the zones 76 may be formed on the top, bottom, or the sides of the core 74.

Referring now to FIG. 1C(4), each periodic arrangement 70 and 72 has zones 88 formed on and partially around the core 74. The zones 88 alternate with zones 78 made from the thermo-optical material 80, discussed more fully below. The period $\Lambda_1$ and $\Lambda_2$ associated with each periodic arrangement 70 and 72 differ. Further, although not shown, it is within the scope of this invention that the zones 88 may be formed partially around or completely around the core 74.

Referring now to FIG. 1C(5), a layer 90 is formed on the top surface of the core 74 and includes ridged structures 92.

Each periodic arrangement 70 and 72 has ridged structures 92 that alternate with zones 78 made from the thermo-optical material 80, more fully described below. Further, although not shown, it is within the scope of this invention that the layer 90 including the ridged structures 92 may be formed on the top, the bottom, or the sides of the core 74 or, alternatively, partially around or completely around the core 74.

Referring now to FIG. 1C(6), the preferred embodiment of the first and the second periodic arrangement 70 and 72 is shown. Specifically, a silicon dioxide ($SiO_2$) layer 94 is deposited on the core 74 and then pattern etched. The pattern etch produces zones 96 which alternate with zones 78 that are filed with thermo-optical material 80. Each periodic arrangement 70 and 72 includes zones 96. The preferred embodiment of the first and the second periodic arrangement 70 and 72, namely, FIG. 1C(6), shall be used in the discussions below.

In the preferred embodiment, each periodic arrangement and adjacent thermo-optical material has the same refractive index when both the periodic arrangements and the adjacent thermo-optical material are at an off temperature. The off temperature has a tolerance of several degrees Celsius and may lie in the range from approximately −65° Celsius to 100° Celsius. In the preferred embodiment, the off temperature corresponds to the temperature of the substrate 12 when the heat sinks (not shown) are on. In an alternative embodiment, the off temperature may correspond to a temperature that is either higher than or lower than the temperature of the substrate 12 when the heat sinks (not shown) are on. In such an alternative embodiment, multiple periodic arrangements are continually activated which creates multiple diffractive gratings.

When the temperature of the thermo-optical material adjacent to a chosen periodic arrangement is changed to a temperature other than the off temperature, the index of refraction of that thermo-optical material begins to differ from the index of refraction of the chosen periodic arrangement. This creates and hence activates a diffraction grating that has a pitch spacing ($\Lambda$). The pitch spacing ($\Lambda$) can vary in the range between about 0.1 to about 10 $\mu$m. More preferably, the diffraction grating is a Bragg grating with an associated Bragg wavelength ($\lambda_B$). The Bragg wavelength is linked to the effective index ($n_{eff}$) of the waveguide, defined below, and the pitch spacing ($\Lambda$) of the correspondingly activated diffraction grating by the following formula:

$$\lambda_B(i) = 2n_{eff}(i)\Lambda(i)$$

In this formula, the index (i) assumes one of the values of the chosen periodic arrangement. In FIG. 1, the index (i) can be 1 or 2 which correspond to the first or second periodic arrangements 70 and 72. Note that the pitch spacing of the activated diffraction grating equals the period of the chosen periodic arrangement.

During operation of the laser 10, a single optical mode propagates along the core 74. A portion of this optical mode propagates through the first and second periodic arrangements 70 and 72. In the preferred embodiment of the periodic arrangements and as illustrated in FIG. 1C(6), the portion ($\Gamma$) (shaded region) of the optical mode propagating through and hence which sees the first and second periodic arrangements 70 and 72 is between about 0.1% and 50%. Also, as portions of the thermo-optical material 80 adjacent to the core 74 and along the z-axis are heated while other portions remain at room temperature, the size and shape of the optical mode along the z direction of the core 74 changes, but the change is preferably gradual, adiabatic, and therefore with minimal optical loss.

Bragg wavelengths of the different periodic arrangements are spread out to cover a wide wavelength range. One can change the grating pitch and/or the effective index of the waveguide. One way to increase the effective index in the waveguide is to put in the index loaded region by introducing impurity near the waveguide core, FIGS. 1C(1) and 1C(2). One of advantages of this approach is to achieve different Bragg wavelengths for different periodic arrangement using the same grating pitch which would simplify the grating making processes.

Figure 1D:
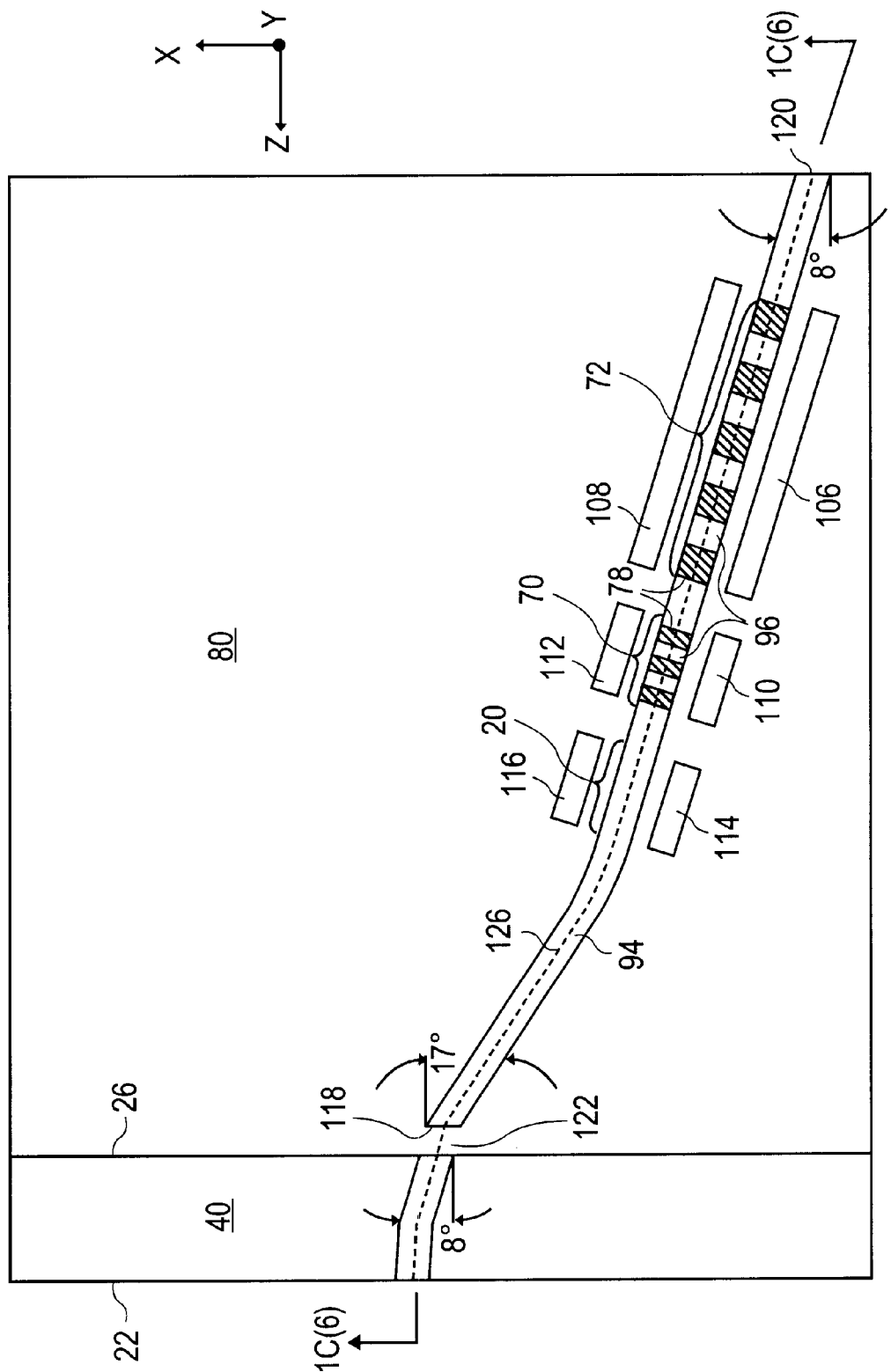
FIG. 1D is a top view of the sixth embodiment shown in FIG. 1C(6)
Figure 1E:
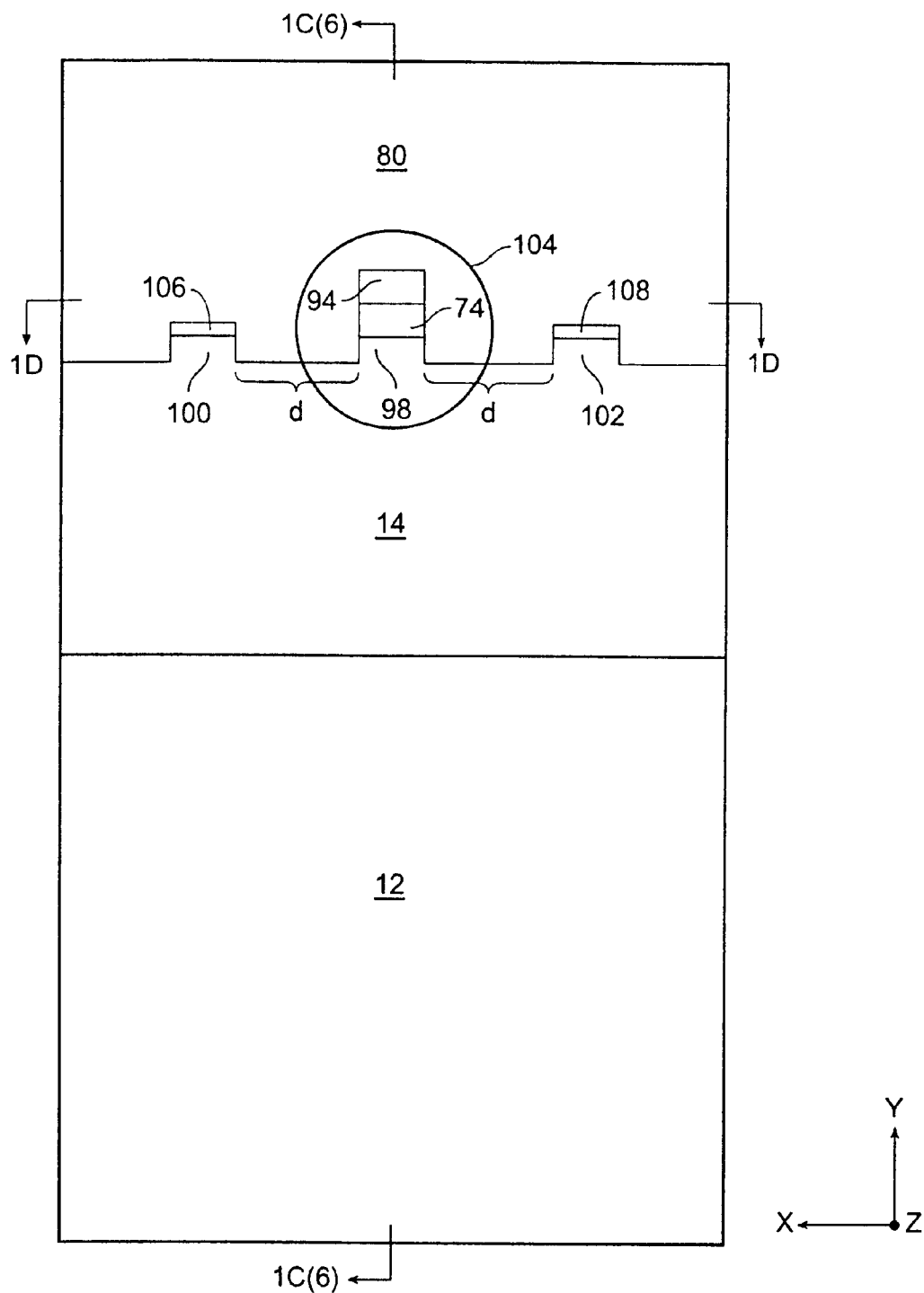
FIG. 1E is a front view of the heaters and the waveguide along the line 1E—1E in FIG. 1A and associated with the sixth embodiment shown in FIG. 1C(6) and FIG. 1D.

Referring now to FIGS. 1D and 1E, the temperature changing means associated with the first and the second periodic arrangements 70 and 72 and the phase control section 20 are shown. Specifically, referring to FIG. 1E, the cladding layer 14 is etched to produce pedestal regions 98, 100, and 102. The depth of the pedestals 98, 100, and 102 may vary from about 0 to 10 microns. A silicon nitride ($Si_3N_4$) layer is deposited on the pedestal region 98 and etched which defines the core 74. Upon the silicon nitride core 74, the silicon dioxide layer 94 is deposited and then pattern etched, as discussed above, with the silicon nitride core 74 acting as an etch stop layer for the silicon dioxide. The core 74 can also be any optical material with a higher index of refraction that the cladding layer 14 such as a doped silica with germanium, nitrogen, lead, tin, phosphorous, boron, or combinations thereof. A waveguide 104 includes the core 74, the silicon dioxide layer 94, portions of the thermo-optical material 80 adjacent to the silicon dioxide layer 94, and portions of the cladding layer 14 beneath the core 74. The diameter of the waveguide 100 encompasses most of the optical mode.

Heaters 106 and 108 are disposed upon pedestal regions 100 and 102 which are disposed on both sides of the second periodic arrangement 72 (FIG. 1D). The length of the heaters 106 and 108 exceed the length of the second periodic arrangement 72, or are otherwise designated so that the entire length of the second periodic arrangement 72 can be maintained at a uniform temperature. The heaters 106 and 108 are chromium (Cr) in this embodiment, but may be of any conductive material including NiCr, Ti and W. Electrical contacts and wires (both not shown) are provided to apply a potential to or for passing current through each heater. The total lateral distance from the heaters 106 and 108 to the core 74 is the distance (d). The distance (d) is chosen so that (a) the optical mode experiences minimal absorption loss caused by the material of the heaters and (b) the temperature of the thermo-optical material 80 adjacent to the core 74 can be quickly and efficiently changed. The heaters shown in FIG. 1 are resistive heaters, but this invention contemplates the use of thermoelectric heaters or coolers that employ the Peltier effect. The first periodic arrangement 70 and the phase control section 20 also have the same pedestal and heater structure as that shown in FIG. 1E. As shown in FIG. 1D, pair of heaters 110 and 112 are disposed on both sides of the first periodic arrangement 70 and a pair of heaters 114 and 116 are disposed on both sides of the phase control section 20. The length of the heaters 110 and 112 exceeds the length of the first periodic arrangement 70 or are otherwise designated so that the entire length of the first periodic arrangement 70 can be maintained at a uniform temperature. The pair of heaters 114 and 116 are also adjacent to a periodic arrangement free portion of the core 74. It is also within the scope of this invention to replace the pair of heaters around individual optical elements with a single pair of heaters around groups of two or more optical elements. It is also within the scope of this invention to locate the heaters in other structures near the core 74 such as above or within the thermo-optical material 80 or the cladding layer 14.

Referring now to FIG. 1D, the core 74 is optically coupled to the active emission section 40. Specifically, the core 74 includes a first end 118 which is aligned with that portion of the active emission section 40 that is between the trenches 66 and 68. The core 74 also includes a second end 120 which may preferably have either an AR coating or a partially reflective and partially transmissive coating, depending on whether light exits the laser 10 via the second end 120. Most preferably, the active emission layer 40 between the trenches 66 and 68 is aligned with the first end 118 along the y (thickness) and x (width) directions and a gap 122 between the first facet 26 and the first end 118 is minimized in order to minimize the divergence of the light as the light propagates between the first facet 26 and the first end 118 and to maximize the light coupled from the active emission section 40 to the core 74, as much as possible, without introducing any parasitic reflections. Further, in the preferred embodiment, the gain means 16 and the core 74 are designed so that the size of the optical mode propagating from the active emission layer 40 into and then along the core 74 remains approximately constant and with minimal optical loss. Alternatively, a taper (not shown) can be formed adjacent to the core 74 and a surface of the taper can be aligned with that portion of the active emission layer 40 that is between the trenches 66 and 68 so as to couple as much of the light produced by the active emission layer 40 as possible into the core 74. As a second alternative, the taper (not shown) can be directly incorporated into the gain means 16, rather than into the core 74.

The thermo-optical material 80 is applied onto and over the heaters 106, 108, 110, 112, 114, and 116, the silicon dioxide layer 94 containing the first and second periodic arrangements 70 and 72, and onto the cladding layer 14 to provide coverage without incorporating voids or bubbles. The thermo-optical material 80 also fills the gap 122 between the first facet 26 and the first end 118, providing an advantageous index matching effect. To enable electrical connection to the n-contact 36 (FIG. 1A), a portion of the thermo-optical material 80 is removed, preferably by reactive ion etching through a lithographically patterned mask, from a region above the gain means 16 which leaves a slot 124 (FIG. 1A).

The thermo-optical material 80 has a large dn/dt, that is, a local change in temperature of the thermo-optical material will substantially change the local refractive index of the thermo-optical material. Typically, the thermo-optical material 80 has a high coefficient of variation in its' refractive index as a function of temperature, the magnitude of which is preferably greater than $1 \times 10^{-4}/°$ C. Further, the thermo-optical material 80 has a large dn/dt over a large temperature range which allows for a large potential tuning range. Specific materials may be selected for the thermo-optical material include, but are not limited to, methacrylates, siloxanes, carbonates, styrenes, cyclic olefins, and norbornenes. It is useful to adjust the index of refraction of these materials by fluorination (replacing hydrogen molecules with fluorine molecules in the molecular formula of some of the polymer repeat units) as this has the added benefit of reducing the optical loss in the infrared region. Many of these materials meet the optical specifications for the thermo-optical material 80. A specific material may be chosen according to an optimization process of the secondary characteristics such as minimizing birefringence, residual stress, and chemical reactivity, while maximizing wetting, adhesion, working lifetime, and thermal resistance. The thickness of the thermo-optical material 80 is chosen such that the thermo-optical material-air interface adds only minimal and preferably no optical loss to the optical performance of the laser 10.

Referring again to FIG. 1D, the optical path of the laser 10 is shown. In FIG. 1, light propagates along the active emission layer 40 between the trenches 66 and 68 and the the core 74 which collectively define an optical axis 126 within the laser 10. The optical axis 126 is angled near the first facet 26 and near the second end 120 so that the optical axis 126 traverses the intracavity and extracavity interfaces at a non-normal angle so as to prevent parasitic reflections from degrading the performance of the laser 10. The optical axis 126 is curved within the active emission layer 40 so that the second facet 28 forms one end and the periodic arrangements 70 and 72 (FIG. 1C(4)) forms the other end of the laser cavity associated with the laser 10. In order for the laser 10 to lase, the gain associated with active emission layer 40 must be greater than losses associated with the gain means and the laser cavity. The losses associated with the laser cavity include, but are not limited to: the coupling losses between the first facet 26 and the first end 118, the losses propagating through the thermo-optical material 80 and the waveguide 104, the reflection losses associated with the periodic arrangements 70 and 72, the reflections at the interfaces 26 and 118, and any other parasitic reflections. Each loss element in the laser cavity shown should be no larger than a few decibels (dB) and preferably smaller than 0.5 dB so that the collective single pass loss along the optical axis 126 of the laser cavity is no larger than about 5 to 20 decibels.

The dynamic operation of the laser 10 shown in FIG. 1 shall now be discussed. Amplification current supplied to the bonding layer 36 (FIG. 1B) and the portion of the bonding layer 62 (FIG. 1B) in electrical contact with active layer 40 (FIG. 1B) between the trenches 66 and 68 (FIG. 1B) causes gain in the active layer 40 and light to propagate through the gap 118 and into the core 74.

With the heaters 106, 108, 110, and 112 off and not generating heat, both periodic arrangements 70 and 72 and the thermo-optical material 80 adjacent to both periodic arrangements are at the off temperature, namely, the temperature of the substrate 12. At the off temperature, the diffraction gratings associated with both periodic arrangements are neither created nor activated. Hence, light is not reflected. Under these conditions, the round trip loss in the laser cavity exceeds the round trip gain and the laser 10 will not lase.

Figure 2A:
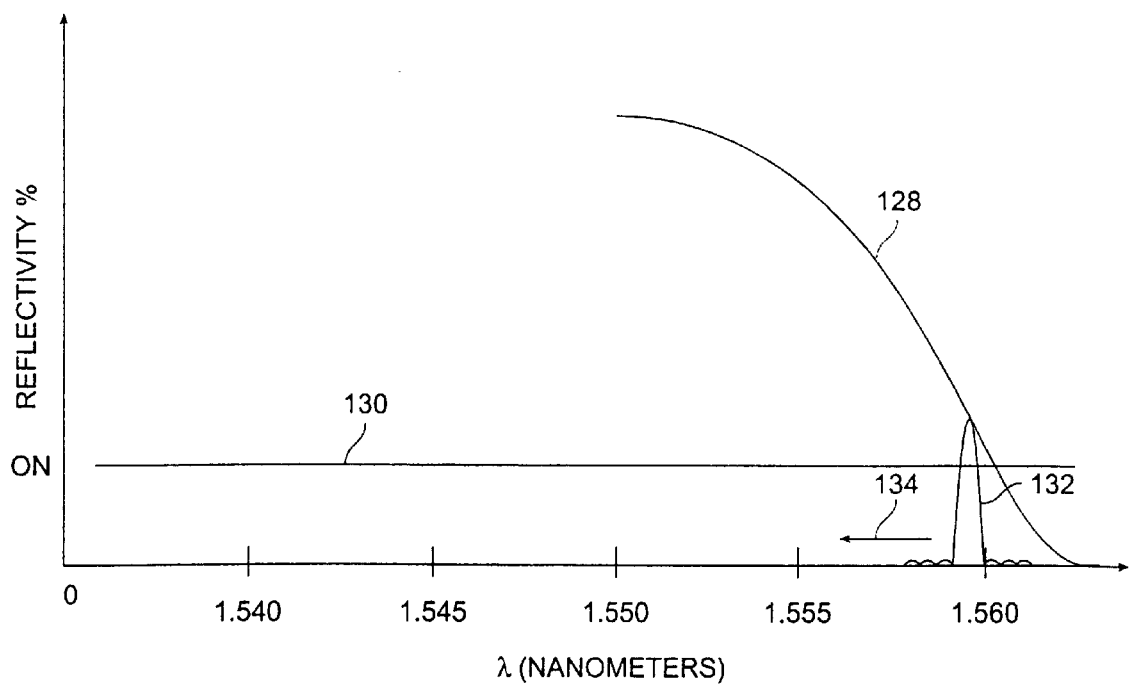
FIGS. 2A and 2B are diagrammatic representations of a reflection spectrum associated with a first periodic arrangement of the sixth embodiment shown under the influence of thermal tuning.
Figure 2B:
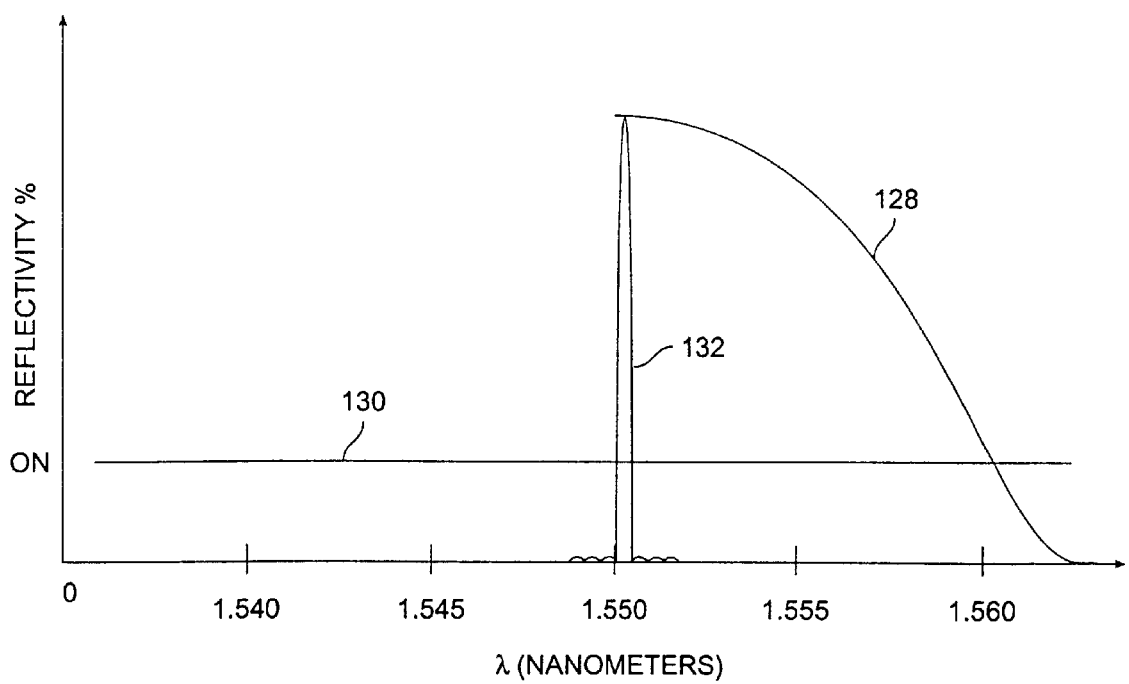

With the heaters 110 and 112 disposed on both sides of the first periodic arrangement 70 turned on and generating heat, the refractive index of the thermo-optical material 80 adjacent to the first periodic arrangement 70 begins to differ from the refractive index of the first periodic arrangement 70. This difference in the refractive indexes creates and hence activates the diffraction grating associated with the first periodic arrangement. As shown in FIGS. 2A and 2B, the diffraction grating is a Bragg grating. The Bragg grating reflects light of particular wavelengths and the degree to which the Bragg grating reflects light is represented by a reflection curve 128. The reflectivity level of the Bragg grating that will cause lasing in the laser 10 is shown in FIGS. 2A and 2B an on state 130. At reflectivity levels less than the on state 130, the laser 10 will not lase while, at reflectivity levels equal to or greater than on state 130, the laser 10 will lase. In FIG. 2A, a reflection peak 132 associated with the Bragg grating is shown and the reflectivity level associated with the reflection peak 132 is slightly greater than the on state 130 which indicates that the laser 10 is lasing. In the current industry jargon, the Bragg grating with reflection peak 132 in FIG. 2A is "weakly" on.

In general, as the temperature in the thermo-optical material adjacent to a chosen periodic arrangement increases or decreases beyond the off temperature (depending on the composition of the thermo-optical material), the difference in the refractive index between the chosen periodic arrangement and the adjacent thermo-optical material increases. This increased difference in the refractive index increases the reflectivity of the diffraction grating associated with the chosen periodic arrangement and also shifts the Bragg wavelength. More specifically, thermo-optical material exists which has a large positive or negative dn/dt in response to either cooling or heating of the thermo-optical material. In FIGS. 1 and 2, the thermo-optical material 80 has a negative dn/dt in response to increases in temperature, that is, as the temperature of the thermo-optical material 80 increases, the refractive index of the thermo-optical material 80 decreases. Stated another way, the maximum value of the refractive index of the thermo-optical material 80 is when the thermo-optical material is at the off temperature. In FIG. 2, the portion of the reflection curves 128 and 136 located near zero reflectivity corresponds to the first and the second periodic arrangements 70 and 72, respectively, at the off temperature.

As the temperature in the thermo-optical material 80 adjacent to the first periodic arrangement continues to increase, the refractive index of the thermo-optical material adjacent to the first periodic continues to decrease. This increased difference in the refractive index between the first periodic arrangement and the adjacent thermo-optical material increases the reflectivity of the Bragg grating and also shifts the Bragg wavelength associated with the Bragg grating. An arrow 134 indicates the direction in which the reflection peak 132 moves in response to increases in the difference of the refractive index of the first periodic arrangement 70 and the adjacent thermo-optical material 80 caused by the heaters 110 and 112. In the current industry jargon, the diffraction grating is "strengthened" as the reflection peak 132 moves in the direction indicated by the arrow 134 towards a maximum reflectivity level, as shown in FIG. 2B. With the Bragg grating associated with the first periodic arrangement activated, the laser 10 can be tuned to and hence lase at any cavity mode (not shown) located between about 1550 and 1560 nanometers in this case. Further, if necessary, these cavity modes (not shown) can be slightly shifted by the use of the heaters 114 and 116 in the phase control section 20 to align a given cavity mode with the reflection peak 132.

Figure 2C:
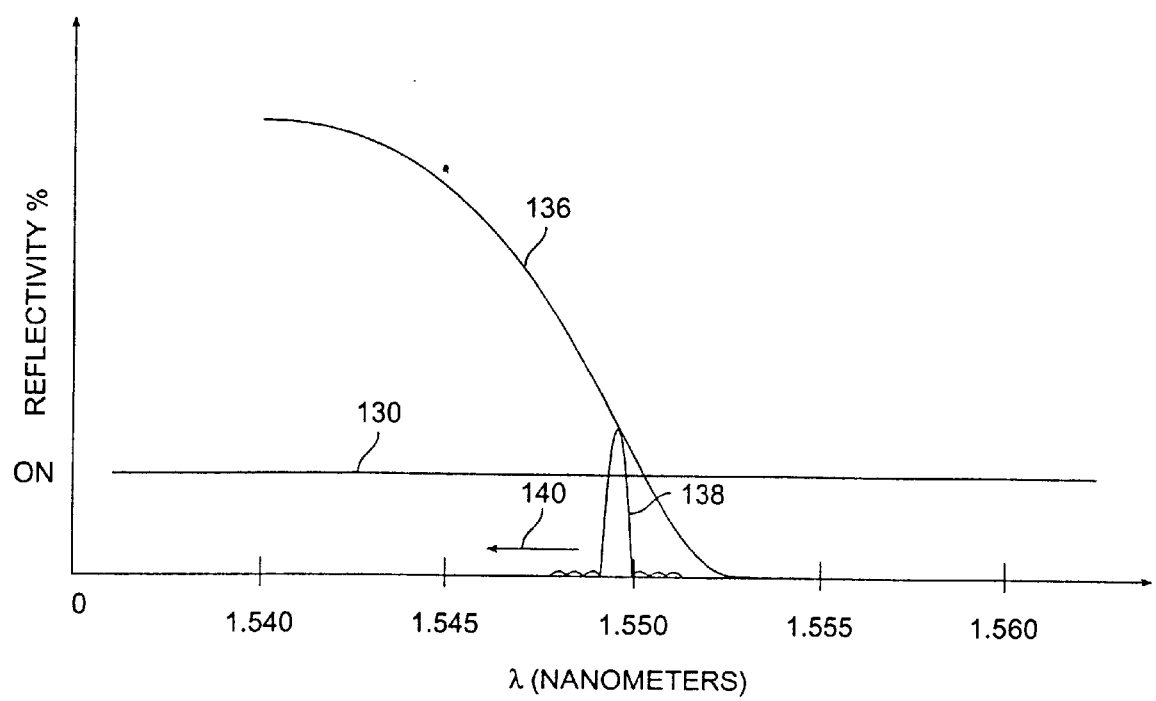
FIGS. 2C and 2D are diagrammatic representations of a reflection spectrum associated with a second periodic arrangement of the sixth embodiment under the influence of thermal tuning.
Figure 2D:
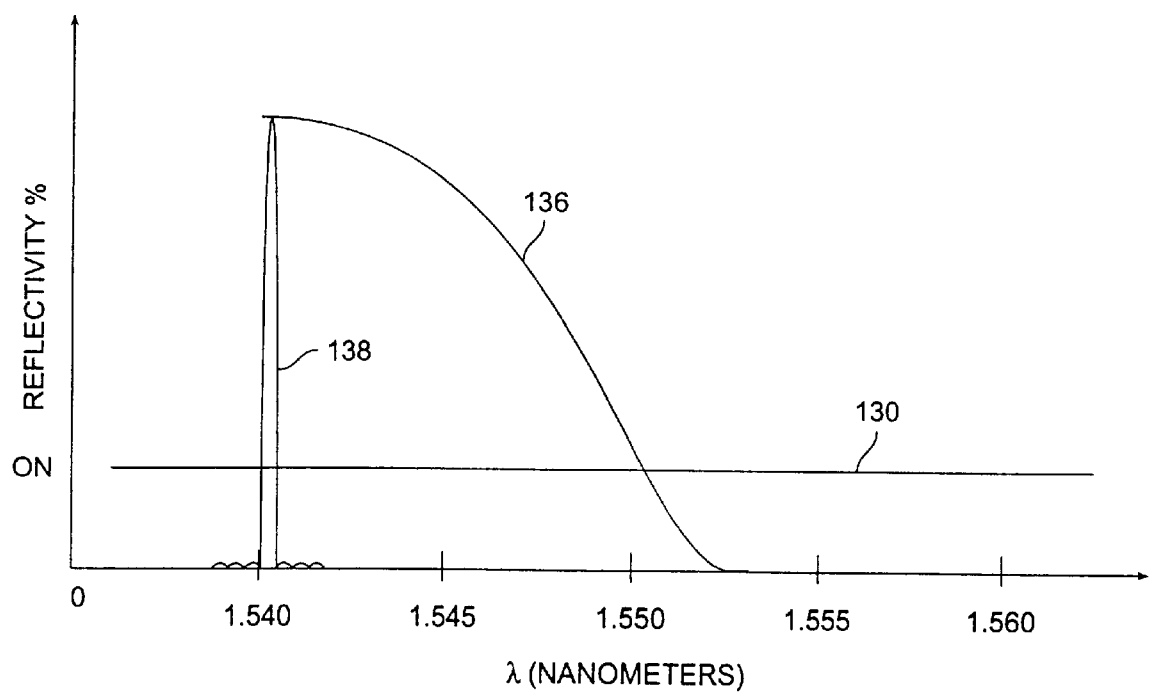

The heaters 110 and 112 are now turned off so that the temperature of the thermo-optical material 80 adjacent to the first periodic arrangement 70 returns to the off temperature. This causes the value of the refractive index of the thermo-optical material 80 adjacent to the first periodic arrangement 70 to return to the value of the refractive index of the first periodic arrangement 70 which is at the off temperature. This causes the reflection peak 132 to move in a direction opposite to arrow 134 and eventually below the one state 130 which de-activates and hence eliminates the diffraction grating associated with the first periodic arrangement. Corresponding with the heaters 106 and 108 being turned off, the heaters 106 and 108 disposed on both sides of the second periodic arrangement 72 are turned on and start to generate heat. In response, the temperature of the thermo-optical material 80 adjacent to the second periodic arrangement 72 increases and the refractive index of the thermo-optical material 80 adjacent to the second periodic arrangement 72 begins to differ from the refractive index of the second periodic arrangement 72. This creates and hence activates the diffraction grating associated with the second periodic arrangement. In FIGS. 2C and 2D, the diffraction grating is also a Bragg grating. The Bragg grating reflects light of particular wavelengths and the degree to which the Bragg grating reflects light is represented by a reflection curve 136. The reflectivity level of the Bragg grating that will cause lasing in the laser 10 is shown in FIGS. 2C and 2D at the on state 130. In FIG. 2C, a reflection peak 138 associated with the Bragg grating is shown and the reflectivity level associated with the reflection peak 138 is slightly greater than the on state 130 which indicates that the laser 10 is lasing. In the current industry jargon, the Bragg grating with reflection peak 138 in FIG. 2C is "weakly" on.

As the temperature in the thermo-optical material 80 adjacent to the second periodic arrangement 72 continues to increase, the refractive index of the thermo-optical material 80 adjacent to the second periodic arrangement also continues to decrease. This increased difference in the refractive index between the second periodic arrangement 72 and the adjacent thermo-optical material increases the reflectivity of the Bragg grating and also shifts the Bragg wavelength associated with the Bragg grating. An arrow 140 indicates the direction in which the reflection peak 138 moves in response to increases in the change of the refractive index of the thermo-optical material 80 adjacent to the second periodic arrangement 72 caused by the heaters 106 and 108. In the current industry jargon, the diffraction grating is "strengthened" as the reflection peak 138 moves in the direction indicated by the arrow 140 towards a maximum reflectivity level, as shown in FIG. 2D. With the Bragg grating associated with the first periodic arrangement activated, the laser 10 can be tuned to and hence lase at any cavity mode (not shown) located between 1540 and 1550 nanometers. Further, if necessary, these cavity modes (not shown) can be slightly shifted by the use of the heaters 114 and 116 in the phase control section 20 to align a given cavity mode with the reflection peak 138.

The sum of the wavelength tuning range of the two periodic arrangements exceeds the tuning range of conventional DBR laser, discussed in the background section, without the problems associated with the Variation DBR laser, discussed in the background section. Specifically, the total continuous tuning range of the laser 10 is 20 nm which is twice the range obtained from a similar conventional DBR laser with only a single periodic arrangement. Further, substantially more than two periodic arrangements can be employed in a laser according to the teachings of this invention thereby further increasing the wavelength tuning range of the resultant laser. This laser, using the thermo-optical material as the tuning mechanism, eliminates the loss associated with tuning semiconductor materials by means of injection current.

Naturally, other variants of the invention are possible. In particular, the thermo-optical material may be replaced with either an electro-optical material or a liquid crystal material. If an electro-optical material were employed, the heaters would be replaced with devices for applying an electric field to the electro-optical material parallel to an electro-optic axis so as to vary the refractive index of the electro-optical material adjacent to the periodic arrangements. Similarly, if a liquid crystal material were employed in place of the thermo-optical material, the heaters would be replaced with devices for applying a voltage across the liquid crystal material so as to vary the refractive index of the liquid crystal material adjacent to the periodic arrangements.

While the invention has been described with respect to the presently preferred embodiments, it will be appreciated by those skilled in the art that modification and changes can be made to the tunable laser of the present invention without departing from its spirit or essential characteristics. Accordingly, all modifications or changes that come within the meaning and range of equivalency of the claims are to be embraced within their scope.

What is claimed is:

1. A wavelength tunable laser comprising:
   a gain means with an active emission section that generates light;
   a waveguide including a core, the core optically coupled to the active emission section for receiving light;
   a substrate supporting the waveguide and the gain means;
   more than one periodic arrangement adjacent to the core, each periodic arrangement having a different period;
   thermo-optical material adjacent to each periodic arrangement, each periodic arrangement and adjacent thermo-optical material having the same refractive index when both the periodic arrangement and the adjacent thermo-optical material are at an off temperature; and
   temperature changing means in the thermo-optical material adjacent to each periodic arrangement.

2. The laser of claim 1 wherein each periodic arrangement forms a diffraction grating whose pitch is equal to the period of the periodic arrangement when the temperature of the thermo-optical material adjacent to the periodic arrangement is increased to temperatures greater than the off temperature.

3. The laser of claim 1 wherein each periodic arrangement forms a diffraction grating whose pitch is equal to the period of the periodic arrangement when the temperature of the thermo-optical material adjacent to the periodic arrangement is decreased to temperatures less than the off temperature.

4. The laser of claim 2 wherein each diffraction grating is a Bragg grating that has a Bragg wavelength.

5. The laser of claim 3 wherein each diffraction grating is a Bragg grating that has a Bragg wavelength.

6. The laser of claim 1 wherein the period of each periodic arrangement is in the range of 0.1 to 10 $\mu$m and the off temperature is in the range of −65° to 100° Celsius.

7. The laser of claim 1 wherein each off temperature associated with each periodic arrangement and adjacent thermo-optical material differs from all other off temperatures.

8. The laser of claim 1 wherein each off temperature associated with each periodic arrangement and adjacent thermo-optical material is the same temperature.

9. The laser of claim 1 wherein the core includes a periodic arrangement-free portion, the periodic arrangement-free portion including a phase control section, the periodic arrangement-free portion being devoid of periodically changing material.

10. The laser of claim 9 further comprising thermo-optical material positioned in proximity to the phase control section and temperature changing means in the thermo-optical material positioned in proximity to the phase control section.

11. The laser of claim 10 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

12. A wavelength tunable laser comprising:
a gain means with an active emission section that generates light;
a wavelength including a core, the core optically coupled to the active emission section for receiving light;
more than one periodic arrangement adjacent to the core, each periodic arrangement having a period;
a substrate supporting the waveguide and the gain means, the substrate including an index loading region adjacent to each periodic arrangement;
thermo-optical material adjacent to each periodic arrangement, each periodic arrangement and adjacent thermo-optical material having the same refractive index when both the periodic arrangement and the adjacent thermo-optical material are at an off temperature; and
temperature changing means in the thermo-optical material adjacent to each periodic arrangement wherein, at a reference temperature, the product of the period associated with each periodic arrangement and an effective refractive index of an optical mode as the optical mode propagates by each periodic arrangement is different for each periodic arrangement.

13. The laser of claim 12 wherein each periodic arrangement forms a diffraction grating whose pitch is equal to the period of the periodic arrangement when the temperature of the thermo-optical material adjacent to the periodic arrangement is increased to temperature greater than the off temperature.

14. The laser of claim 12 wherein each periodic arrangement forms a diffraction grating whose pitch is equal to the period of the periodic arrangement when the temperature of the thermo-optical material adjacent to the periodic arrangement is decreased to temperature less than the off temperature.

15. The laser of claim 13 wherein each diffraction grating is a Bragg grating that has a Bragg wavelength.

16. The laser of claim 14 wherein each diffraction grating is a Bragg grating that has a Bragg wavelength.

17. The laser of claim 12 wherein the period of each periodic arrangement is in the range of 0.1 to 10 $\mu$m and the off temperature is in the range of −65° to 100° Celsius.

18. The laser of claim 12 wherein each off temperature associated with each periodic arrangement and adjacent thermo-optical material differs from all other off temperatures.

19. The laser of claim 12 wherein each off temperature associated with each periodic arrangement and adjacent thermo-optical material is the same temperature.

20. The laser of claim 12 wherein the core includes a periodic arrangement-free portion, the periodic arrangement-free portion including a phase control section, the periodic arrangement-free portion being devoid of periodically changing material.

21. The laser of claim 20 further comprising thermo-optical material positioned in proximity to the phase control section and temperature changing means in the thermo-optical material positioned in proximity to the phase control section.

22. The laser of claim 21 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

23. A wavelength tunable laser comprising:
a gain means with an active emission section that generate light;
a wavelength including a core, the core optically coupled to the active emission section for receiving light;
a substrate supporting the waveguide and the gain means;
more than one periodic arrangement adjacent to the core, each periodic arrangement having a different period;
thermo-optical material adjacent to each periodic arrangement, each periodic arrangement and adjacent thermo-optical material having the same refractive index when both the periodic arrangement and the adjacent thermo-optical material are at an off temperature; and
temperature changing means in the thermo-optical material adjacent to each periodic arrangement whereby, as the temperature of the thermo-optical material adjacent to a chosen periodic arrangement changes to a temperature other than the off temperature, the refractive index of the thermo-optical material adjacent to the chosen periodic arrangement differs from the refractive index of the chosen periodic arrangement which creates a diffraction grating whose pitch is equal to the period of the chosen periodic arrangement.

24. The laser of claim 23 wherein each diffraction grating is a Bragg grating that has a Bragg wavelength.

25. The laser of claim 23 wherein the period of each periodic arrangement is in the range of 0.1 to 10 $\mu$m and the temperature is in the range of −65° to 100° Celsius.

26. The laser of claim 23 wherein each off temperature associated with each period arrangement and adjacent thermo-optical material differs from all other off temperatures.

27. The laser of claim 23 wherein each off temperature associated with each periodic arrangement and adjacent thermo-optical material is the same temperature.

28. The laser of claim 23 wherein the core includes a periodic arrangement-free portion, the periodic arrangement-free portion including a phase control section, the periodic arrangement-free portion being devoid of periodically changing material.

29. The laser of claim 28 further comprising thermo-optical material positioned in proximity to the phase control section and temperature changing means in the thermo-optical material positioned in proximity to the phase control section.

30. The laser of claim 29 wherein the thermo-optical material is selected from the group compromising a polymer derived from methacrylate, a polymer derived from siloxane, a polymer derived from carbonate, a polymer derived from styrene, a polymer derived from cyclic olefin, and a polymer derived from norbornene.

31. A wavelength tunable laser comprising:
a gain means with an active emission section that generates light;
a waveguide including a core, the core optically coupled to the active emission section for receiving light;
more than one periodic arrangement adjacent to the core, each periodic arrangement having a period;
a substrate supporting the waveguide and the gain means, the substrate including an index loading region adjacent to each periodic arrangement;
thermo-optical material adjacent to each periodic arrangement, each periodic arrangement and adjacent thermo-optical material having the same refractive index when both the periodic arrangement and the adjacent thermo-optical material are at an off temperature; and temperature changing means in the thermo-optical material adjacent to each periodic arrangement wherein, at a reference temperature, the product of the period associated with each periodic arrangement and an effective refractive index of an optical mode as the optical mode propagates by each periodic arrangement is different for each periodic arrangement and whereby, as the temperature of the thermo-optical material adjacent to a chosen periodic arrangement changes to a temperature other than the off temperature, the refractive index of the thermo-optical material adjacent to the chosen periodic arrangement differs from the refractive index of the chosen periodic arrangement which creates a diffraction grating whose pitch is equal to the period of the chosen periodic arrangement.

32. The laser of claim 31 wherein each diffraction grating is a Bragg grating that has a Bragg wavelength.

33. The laser of claim 31 wherein the period of each periodic arrangement is in the range of 0.1 to 10 μm and the temperature is in the range of −65° to 100° Celsius.

34. The laser of claim 31 wherein each off temperature associated with each periodic arrangement and adjacent thermo-optical material differs from all other off temperatures.

35. The laser of claim 31 wherein each off temperature associated with each periodic arrangement and adjacent thermo-optical material is the same temperature.

36. The laser of claim 31 wherein the core includes a periodic arrangement-free portion, the periodic arrangement-free portion including a phase control section, the periodic arrangement-free portion being devoid of periodically changing material.

37. The laser of claim 36 further comprising thermo-optical material positioned in proximity to the phase control section and temperature changing means in the thermo-optical material positioned in proximity to the phase control section.

38. The laser of claim 37 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

39. A wavelength tunable filter comprising:
a waveguide including a core;
a substrate supporting the waveguide;
more than one periodic arrangement adjacent to the core, each periodic arrangement having a different period;
thermo-optical material adjacent to each periodic arrangement, each periodic arrangement and adjacent thermo-optical material having the same refractive index when both the periodic arrangement and the adjacent thermo-optical material are at an off temperature; and
temperature changing means in the thermo-optical material adjacent to each periodic arrangement.

40. The filter of claim 39 wherein each periodic arrangement forms a diffraction grating whose pitch is equal to the period of the periodic arrangement when the temperature of the thermo-optical material adjacent to the periodic arrangement is increased to temperature greater than the off temperature.

41. The filter of claim 39 wherein each periodic arrangement forms a diffraction grating pitch is equal to the period of the periodic arrangement when the temperature of the thermo-optical material adjacent to the periodic arrangement is decreased to temperatures less than the off temperature.

42. The filter of claim 40 wherein each diffraction grating is a Bragg grating that has a Bragg wavelength.

43. The filter of claim 41 wherein each diffraction grating is a Bragg grating that has a Bragg wavelength.

44. The filter of claim 39 wherein the period of each periodic arrangement is in the range of 0.1 to 10 μm and the off temperature is in the range of −65° to 100° Celsius.

45. The filter of claim 39 wherein each off temperature associated with each periodic arrangement and adjacent thermo-optical material differs from all other off temperatures.

46. The filter of claim 39 wherein each off temperature associated with each periodic arrangement and adjacent thermo-optical material is the same temperature.

47. The filter of claim 39 wherein the core includes a periodic arrangement-free portion, the periodic arrangement-free portion including a phase control section, the periodic arrangement-free portion being devoid of periodically changing material.

48. The filter of claim 47 further comprising thermo-optical material positioned in proximity to the phase control section and temperature changing means in the thermo-optical material positioned in proximity to the phase control section.

49. The filter of claim 48 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

50. A wavelength tunable filter comprising:
a waveguide including a core;
more than one periodic arrangement adjacent to the core, each periodic arrangement having a period;
a substrate supporting the waveguide, the substrate including an index loading region adjacent to each periodic arrangement;
thermo-optical material adjacent to each periodic arrangement, each periodic arrangement and adjacent thermo-optical material having the same refractive index when both the periodic arrangement and the adjacent thermo-optical material are at an off temperature; and
temperature changing means in the thermo-optical material adjacent to each periodic arrangement wherein, at a reference temperature, the product of the period associated with each periodic arrangement and an effective refractive index of an optical mode as the optical mode propagates by each periodic arrangement is different from each periodic arrangement.

51. The filter of claim 50 wherein each periodic arrangement forms a diffraction grating whose pitch is equal to the period of the periodic arrangement when the temperature of the thermo-optical material adjacent to the periodic arrangement is increased to temperatures greater than the off temperature.

52. The filter of claim 50 wherein each periodic arrangement forms a diffraction grating whose pitch is equal to the period of the periodic arrangement when the temperature of the thermo-optical material adjacent to the periodic arrangement is decreased to temperatures less than the off temperature.

53. The filter of claim 51 wherein each diffraction grating is a Bragg grating that has a Bragg wavelength.

54. The filter of claim 52 wherein each diffraction grating is a Bragg grating that has a Bragg wavelength.

55. The filter of claim 50 wherein the period of each periodic arrangement is in the range of 0.1 to 10 μm and the off temperature is in the range of −65° to 100° Celsius.

56. The filter of claim 50 wherein each off temperature associated with each periodic arrangement and adjacent thermo-optical material differs from all other off temperatures.

57. The filter of claim 50 wherein each off temperature associated with each periodic arrangement and adjacent thermo-optical material is the same temperature.

58. The filter of claim 50 wherein the core includes a periodic arrangement-free portion, the periodic arrangement-free portion including a phase control section, the periodic arrangement-free portion being devoid of periodically changing material.

59. The filter of claim 58 further comprising thermo-optical material positioned in proximity to the phase control section and temperature changing means in the thermo-optical material positioned in proximity to the phase control section.

60. The filter of claim 59 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

61. A wavelength tunable filter comprising:

a waveguide including a core;

a substrate supporting the waveguide;

more than one periodic arrangement adjacent to the core, each periodic arrangement having a different period;

thermo-optical material adjacent to each periodic arrangement, each periodic arrangement and adjacent thermo-optical material having the same refractive index when both the periodic arrangement and the adjacent thermo-optical material are at an off temperature; and temperature changing means in the thermo-optical material adjacent to each periodic arrangement whereby, as the temperature of the thermo-optical material adjacent to a chosen periodic arrangement changes to a temperature other than the off temperature, the refractive index of the thermo-optical material adjacent to the chosen periodic arrangement differs from the refractive index of the chosen periodic arrangement which creates a diffraction grating whose pitch is equal to the period of the chosen periodic arrangement.

62. The filter of claim 61 wherein each diffraction grating is a Bragg grating that has a Bragg wavelength.

63. The filter of claim 61 wherein the period of each periodic arrangement is in the range of 0.1 to 10 μm and the temperature is in the range of −65° to 100° Celsius.

64. The filter of claim 61 wherein each off temperature associated with each periodic arrangement and adjacent thermo-optical material differs from all other off temperatures.

65. The filter of claim 61 wherein each off temperature associated with each periodic arrangement and adjacent thermo-optical material is the same temperature.

66. The filter of claim 61 wherein the core includes a periodic arrangement-free portion, the periodic arrangement-free portion including a phase control section, the periodic arrangement-free portion being devoid of periodically changing material.

67. The filter of claim 66 further comprising thermo-optical material positioned in proximity to the phase control section and temperature changing means in the thermo-optical positioned in proximity to the phase control section.

68. The filter of claim 67 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

69. A wavelength tunable filter comprising:

a waveguide including a core;

more than one periodic arrangement adjacent to the core, each periodic arrangement having a period;

a substrate supporting the waveguide, the substrate including an index loading region adjacent to each periodic arrangement;

thermo-optical material adjacent to each periodic arrangement, each periodic arrangement and adjacent thermo-optical material having the same refractive index when both the periodic arrangement and the adjacent thermo-optical material are at an off temperature; and temperature changing means in the thermo-optical material adjacent to each periodic arrangement wherein, at a reference temperature, the product of the period associated with each periodic arrangement and an effective refractive index of an optical mode as the optical mode propagates by each periodic arrangement is different for each periodic arrangement and whereby, as the temperature of the thermo-optical material adjacent to a chosen periodic arrangement changes to a temperature other than the off temperature, the refractive index of the thermo-optical material adjacent to the chosen periodic arrangement differs from the refractive index of the chosen periodic arrangement which creates a diffraction grating whose pitch is equal to the period of the chosen periodic arrangement.

70. The filter of claim 69 wherein each diffraction grating is a Bragg grating that has a Bragg wavelength.

71. The filter of claim 69 wherein the period of each periodic arrangement is in the rage of 0.1 to 10 μm and the temperature is in the range of −65° to 100° Celsius.

72. The filter of claim 69 wherein each off temperature associated with each periodic arrangement and adjacent thermo-optical material differs from all other off temperatures.

73. The filter of claim 69 wherein each off temperature associated with each periodic arrangement and adjacent thermo-optical material is the same temperature.

74. The filter of claim 69 wherein the core includes a periodic arrangement-free portion, the periodic arrangement-free portion including a phase control section, the periodic arrangement-free portion being devoid of periodically changing material.

75. The filter of claim 74 further comprising thermo-optical material positioned in proximity to the phase control section and temperature changing means in the thermo-optical material positioned in proximity to the phase control section.

76. The filter of claim 75 wherein the thermo-optical material is selected from the group comprising a polymer derived from methacrylate, a polymer derived from siloxane, a polymer derived from carbonate, a polymer derived from styrene, a polymer derived from cyclic olefin, and a polymer derived from norbornene.

* * * * *

UNITED STATES PATENT AND TRADEMARK OFFICE
CERTIFICATE OF CORRECTION

PATENT NO. : 6,647,032 B1  Page 1 of 1
DATED : November 11, 2003
INVENTOR(S) : Lee et al.

It is certified that error appears in the above-identified patent and that said Letters Patent is hereby corrected as shown below:

Column 11,
Line 8, delete the third occurrence of "the".

Signed and Sealed this

Twenty-fourth Day of February, 2004

JON W. DUDAS
*Acting Director of the United States Patent and Trademark Office*